US009240293B2

(12) United States Patent
Salka et al.

(10) Patent No.: US 9,240,293 B2
(45) Date of Patent: Jan. 19, 2016

(54) CIRCUIT TRACER

(75) Inventors: Corey Salka, Seattle, WA (US); Adi Shamir, Kidron (IL)

(73) Assignee: Panoramic Power Ltd., Kfar Saba (IL)

( * ) Notice: Subject to any disclaimer, the term of this patent is extended or adjusted under 35 U.S.C. 154(b) by 364 days.

(21) Appl. No.: 13/032,291

(22) Filed: Feb. 22, 2011

(65) Prior Publication Data

US 2011/0208450 A1 Aug. 25, 2011

Related U.S. Application Data

(60) Provisional application No. 61/306,552, filed on Feb. 22, 2010.

(51) Int. Cl.
*H01H 9/16* (2006.01)
*G01R 31/327* (2006.01)
*G01R 31/04* (2006.01)

(52) U.S. Cl.
CPC ............... *H01H 9/167* (2013.01); *G01R 31/04* (2013.01); *G01R 31/327* (2013.01); *H01H 2300/03* (2013.01); *Y02B 90/224* (2013.01); *Y04S 20/14* (2013.01)

(58) Field of Classification Search
CPC .. G01R 31/04; G01R 31/3277; G01R 31/327; H01H 2300/03; H01H 9/167; H02J 3/00; H02J 1/12; H02J 1/102
USPC .......................................................... 702/62
See application file for complete search history.

(56) References Cited

U.S. PATENT DOCUMENTS

| 4,945,346 | A | 7/1990 | Schmiemann |
| 4,998,059 | A | 3/1991 | Nigon et al. |
| 5,519,329 | A | 5/1996 | Satterwhite |
| 6,018,700 | A | 1/2000 | Edel |
| 6,163,144 | A | 12/2000 | Steber et al. |
| 6,259,372 | B1 | 7/2001 | Taranowski et al. |
| 7,057,401 | B2 * | 6/2006 | Blades .......................... 324/713 |
| 7,145,322 | B2 | 12/2006 | Solveson et al. |
| 7,253,602 | B2 | 8/2007 | Shvach et al. |
| 7,412,338 | B2 | 8/2008 | Wynans et al. |
| 7,453,267 | B2 | 11/2008 | Westbrock, Jr. et al. |
| 2005/0212526 | A1 | 9/2005 | Blades |
| 2006/0119344 | A1 | 6/2006 | Benke et al. |
| 2007/0063688 | A1 | 3/2007 | Nguyen |
| 2007/0136010 | A1 * | 6/2007 | Gunn et al. ..................... 702/62 |
| 2007/0139055 | A1 | 6/2007 | Cockrill |
| 2010/0085894 | A1 * | 4/2010 | Johnson et al. ............... 370/254 |
| 2012/0208479 | A1 | 8/2012 | Pistor et al. |

OTHER PUBLICATIONS

"International Search Report and Written Opinion of the International Searching Authority Dated May 20, 2011, International Application No. PCT/US2011/025763".

* cited by examiner

*Primary Examiner* — Eliseo Ramos Feliciano
*Assistant Examiner* — Terence Stifter, Jr.
(74) *Attorney, Agent, or Firm* — Blakely Sokoloff Taylor & Zafman LLP

(57) ABSTRACT

A circuit tracer for use with circuit breakers equipped with sensors capable of sensing at least a change in the power consumption of the circuit and transmitting, preferably wirelessly, such information. The information is received directly or indirectly by a circuit tracer having a display, the display showing all the circuit breakers equipped with the sensors. Upon changing the load of an electricity outlet, such as a wall outlet, a light source, HVAC, pump, electrical machinery, etc., the sensor equipped circuit breaker provides an indication of such power or current consumption change to the circuit tracer. This allows the user of the circuit tracer to associate on the circuit tracer the circuit breaker with the specific electricity outlet. The association information may be saved on a central server or database for future use.

13 Claims, 3 Drawing Sheets

CIRCUIT TRACER

CROSS-REFERENCE TO RELATED APPLICATIONS

This application claims the benefit of U.S. Provisional Patent Application No. 61/306,552 filed Feb. 22, 2010 and is hereby incorporated by reference for all that it contains.

BACKGROUND OF THE INVENTION

1. Field of the Invention

The invention generally relates to the measurement of power consumption, and more specifically to the association of an electricity outlet with a respective circuit breaker or association of a power consuming device with a sensor using non-intrusive and self-powered measurement of electrical current flow through the power line, such as the power line of the circuit breaker or a power consuming device.

2. Prior Art

In a typical electricity distribution system, power is provided through a main circuit breaker and a device for measurement of the power consumption of the entire electrical network connected thereto. However, typically, the main power line is then connected to a plurality of smaller circuit breakers, each feeding a smaller section of the electrical network with its specific power requirements. The smaller circuit breakers (hereafter simply "circuit breaker" or "circuit breakers") are adjusted to the amount of maximum current that may be used by this electrical sub-network. In industrial and commercial applications, hundreds of such circuit breakers may be installed, each controlling a section of the electrical network. Even in smaller locations, such as a house, it is not unusual to find tens of circuit breakers controlling various electrical sub-networks, where each sub-network supplies current to different electrical devices. The current is supplied to one or more devices via an electricity outlet that includes but is not limited to a wall outlet, a device connected through an outlet, a device connected directly to the circuit breaker, a device activated by a switch, a light source, HVAC, pump, electrical machinery, and the like. Devices may be connected to the sub-network through electricity outlets. In some cases, wall outlets may not be connected to a power consuming device at any given time. Other devices may be connected through current switches but with no wall outlets (for example, lighting), or wired directly to the circuit breaker (for example, HVAC, pumps). For the sake of simplicity, all of the above are referred to herein as 'electricity outlets.

It is not unusual as time passes by that the association between the circuit breaker and electricity outlet is lost. This may happen for a variety of reasons including addition or subtraction of electricity outlets and/or circuit breakers. From time to time it is desirable to check the association between a circuit breaker and an electricity outlet. However, such an effort requires at least a two-person team, one person located near the circuit breakers and the other person moving around the facility checking each electricity outlet and communicating back with the other person to ensure coordination as the task progresses. This is both an error prone and costly procedure. Typically, the person near the circuit breakers must switch the circuit breaker between its on and off positions, resulting in a disruption to all the electricity outlets associated with the circuit breaker, regardless of whether such electricity outlet is being checked or not. Alternatively, the second person turns load switches on and off and communicates such activity to the person near the circuit breakers. The first person uses standard current measurement to check the current change on each of the circuit breakers to find the circuit breaker whose current is changed, which is a long and cumbersome process.

Some other prior art solutions are provided for low current implementations in the field of electronics. However, such small signal solutions are not practical for large currents associated with an AC supply. According to one prior art method, a modulated signal is introduced over the actual wires carrying the electrical current. However, because the method is deficient as in the case of the presence of strong interference signals, the operation of such a solution is limited. Moreover, any introduction of, for example, a transformer will result in loss of such modulated signal. This method may result in frequent misdetection due to leakage of the modulated signal to adjacent wires.

In view of the deficiencies of the prior art it would be advantageous to provide a solution for circuit tracing that increases reliability and efficiency of association of a circuit breaker to an electricity outlet. It would be further advantageous if such solution reduces the costs of performing such a task. It would be further advantageous if such task can be achieved without the need to switch the circuit breaker between on and off positions.

DETAILED DESCRIPTION OF THE PREFERRED EMBODIMENTS

The circuit tracer combines the use of circuit breakers or power consuming devices equipped with sensors capable of sensing at least a change in the power consumption of the circuit and transmitting, preferably wirelessly, such information. The information is received directly or indirectly by a circuit tracer having a display, the display showing all the circuit breakers and power consuming devices directly equipped with the sensors. Upon changing the load of an electricity outlet, such as a wall outlet, a device connected through an outlet, a device connected directly to the circuit breaker, a device activated by a switch, a light source, HVAC, pump, electrical machinery, etc., the sensor equipped circuit breaker provides an indication of such power or current consumption change to the circuit tracer. This allows the user of the circuit tracer to associate on the circuit tracer the circuit breaker with the specific electricity outlet. The association information may be saved on a central server or database for future use.

Figure 1:
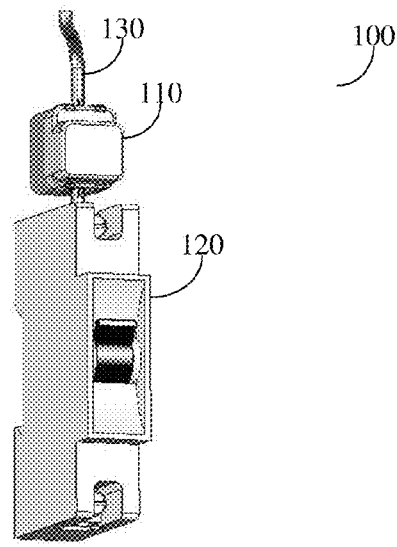
FIG. 1 is a circuit breaker equipped with a compatible self-powered power sensor deployed in accordance with the invention.

In an embodiment of the circuit tracer operative as described herein, it is necessary to equip the circuit breakers with an apparatus that senses the current consumption going through the circuit breaker. Such an apparatus is described in greater detail in a co-pending patent application that claims priority from the co-pending related art, all of which are incorporated herein by reference. Briefly though, FIG. 1 describes an exemplary and non-limiting system 100 that is equipped with a compatible self-powered power sensor (SPPS) 110. The SPPS 110 is designed to fit either before or after the circuit breaker 120, which is of standard size, such that it fits into existing circuit breaker panel boards without modification. Although the circuit breaker 120 is positioned vertically, as is common in European panel boards, the invention applies just as well to horizontally positioned breakers as is more common in the US. The SPPS 110 housing is designed to wrap around the power line 130 leading to or going out of the circuit breaker 120. The SPPS 110 is designed to enable easy installation at an existing location or otherwise during construction when the entire electrical network is put in place. In one embodiment, SPPS 110 is physically integrated into the circuit breaker housing. Therefore, for the purposes of the instant invention the circuit breakers are either equipped with an SPPS 110 or equipped with an integrated circuit breaker where the SPPS 110 is integrated in the same housing. Each SPPS 110 is capable of transmitting wirelessly information related to the current flowing through the circuit breaker. To preserve energy the SPPS 110 is not in transmit mode at all times, rather, it sends information periodically at predetermined intervals of time. In one embodiment, the SPPS 110 is further capable of receiving commands through the wireless interface. Typically, the SPPS 110 enters a receive mode for a short period of time subsequent to transmission of information thereby allowing an optional transmit to the SPPS 110 if such is necessary.

Figure 2:
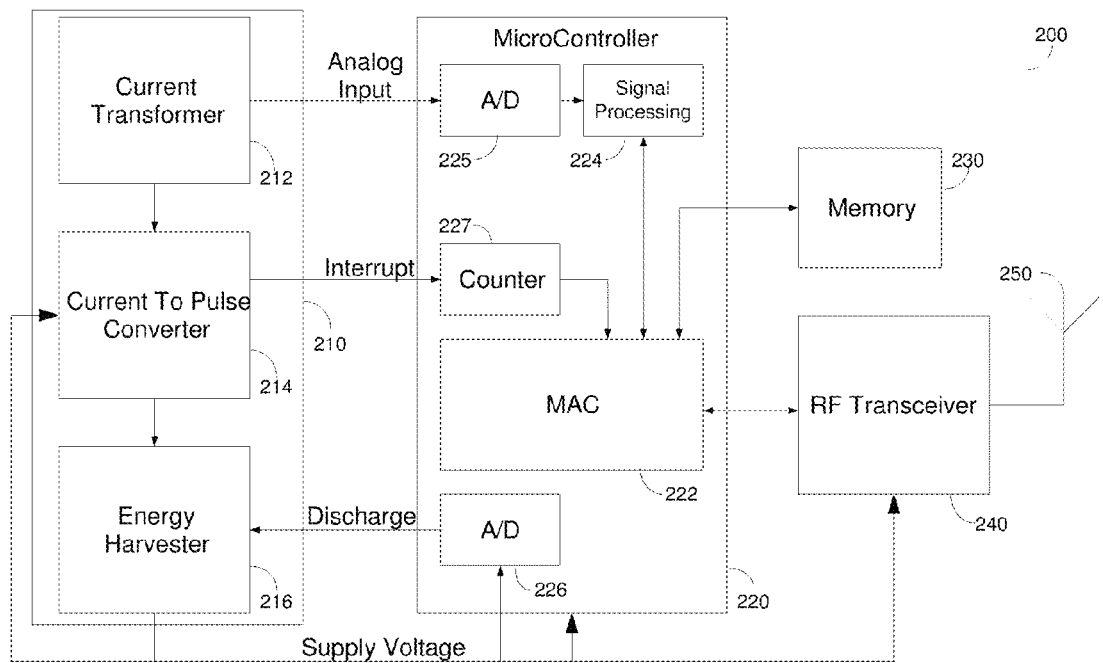
FIG. 2 is a block diagram of an exemplary SPPS.

The SPPS may contain the exemplary and non-liming circuit 200 which is shown in block diagram form in FIG. 2. The circuit 200 comprises an analog section 210 that is coupled to a microcontroller 220. The analog section comprises a current transformer 212 to transform current from the power line, for example power line 130, to a lower current. The power sensed therefrom is used for two purposes, the first is to provide the power needed for the operation of the SPPS 110 and the second is to sense the actual power consumption of the load connected to the power line 130. The current to pulse converter (C2PC) 214 is used to generate periodically a pulse that is provided to the microcontroller unit (MCU) 220 and enables the measurement of the power consumption. The more frequent the pulses the higher the power consumption. The energy harvester 216 stores energy to be used as the power supply for the circuitry of SPPS 110. It is further enabled to receive a discharge signal from the microcontroller 220 to enable intentional discharge of the energy harvester 216 and prevent overcharge. In one embodiment of the invention a Zener diode (not shown) is used to clamp the voltage to the desired level thereby preventing overcharge.

The circuit 200 further comprises a MCU 220 that is comprised of several components. An analog-to-digital (A/D) converter 225 that is coupled to a signal processor 224 which is further coupled to the media access control (MAC) 222 that supports the communication protocol of the SPPS. The MAC 222 provides the data-link layer of the 7 layer standard model of a communication system. This involves the creation in hardware, software, firmware or combination thereof, of data frames, timing their transmission, received signal strength indication (RSSI), acknowledgements, clock synchronization etc. A counter 227 is excited by an interrupt signal received from the analog section 210 and enables the counting of the number of pulses that, as noted above, is proportionate to the power consumed for a given unit of time. Another A/D converter 226 is used to measure the output of the energy harvester 216, and in one embodiment, under control of MCU 220, to cause a discharge thereof as may be needed and as further explained below. In another embodiment, further explained herein below, it can be used to detect that the load connected to the measured power line was turned off. A memory 230 is coupled to the MCU 220 that can be used as scratch pad memory 230 as well as memory for storage of the plurality of instructions that when executed by the MCU 220 executes the methods discussed herein. Memory 230 may comprise random access memory (RAM), read only memory (ROM), non-volatile memory (NVM), other memory types and combinations thereof.

A radio frequency (RF) transceiver 240 is coupled to the MCU 220 and to an antenna 250 to provide one or two-way communication with a management unit, discussed in more detail below. In one embodiment of the invention the RF transceiver 240 supports transmission only, i.e., uplink communication. However, the RF transceiver 240 may comprise a receiver portion to support features such as, and without limitation, sensing for a carrier signal, clock synchronization, acknowledgement, firmware download, and configuration download. Typically, this should be an unlicensed industrial scientific medical (ISM) band transceiver, operative, for example and without limitation, at 2.4 Ghz. In one embodiment some form of spread-spectrum modulation technique may be used, for example and without limitation, direct sequence spread spectrum (DSSS), to enable better coexistence with other systems working in the same environment. The communication rate, discussed in more detail below, should be high enough to enable coexistence of a couple of hundred SPPSs in the same electrical closet. The power consumption of the RF transceiver 240 should be low enough to adhere with the energy harvesting limitations. Yet another requirement of the RF transceiver 240 is to support a communication range sufficient to operate in an electrical closet, e.g., 3-4 meters metallic reach environment. In another embodiment of the invention the range may reach up to a few tens of meters in an indoor environment. This enables the placing of SPPSs on individual devices, e.g., on machines in a production line of a factory, and a minimum number of bridge units in the area. The RF transceiver 240 preferably uses a standard PHY layer supporting, for example and without limitations, IEEE 802.15.4, and/or communication protocol, for example and without limitation, Zigbee. Use of such standards enables easy integration with existing systems that already include wireless hardware, for example and without limitations, smart meters.

According to the principles of the invention, each time a pulse arrives from the C2PC 214 an interrupt signal is sent to the MCU 220. Responsive to receiving the interrupt pulse the MCU 220 wakes up and increases the counter 227 value. The energy stored in each pulse is larger than the energy required for wakeup and counting, hence enough energy is still available for charging the energy harvester 216 and/or enable transmission using the RF transceiver 250. The value of the counter 227 is proportional to the total charge which went through the primary line 130, i.e., current integrated over time. The value in the counter 227, as well as other parameters, are saved in the system's memory 230. The MCU 220 is enabled to periodically check for a condition to transmit. Such a condition may be one or more of the following conditions: sufficient amount of energy exists, upon a certain time lapse from a previous transmission, upon collection of certain data such as significant or otherwise interesting data, and other relevant conditions. According to the principles of the inventions detection of the existence of sufficient amount of energy for transmission, for example, through the A/D converter 226 connected to the energy harvester 216, it is possible to detect if its voltage reached a predetermined value.

Upon determination that a transmission is to take place the MCU 220 prepares a message to be transmitted. The message is typically a single packet of data that may contain various types of information and include the SPPS's unique identification (UID) which enables a management unit to positively associate the current data received with previous data handled by the management unit with respect of the SPPS. The value of counter 227 value, potentially multiplied by a calibration factor converting that value into a normalized charge unit relative to other sensors, for example, Ampere-Hour (AH), may be attached as part of the packet. The calibration factor may be programmed to the SPPS 110 in the NVM of memory 230 during calibration of the circuit 200, as part of final inspection during manufacturing. This ensures compensation against inaccuracies typical to the manufacturing process. The calibration factor may be a fixed value for all units or a specific calibration factor unique to each unit. The latter is useful for overcoming production tolerances of the SPPS. Other information may include, without limitations, various SPPS status information, hardware version, software version, alerts such as overload, phase information, average current, temperature, time duration information, power off indication, e.g., upon identification that the load was turned off, and other system parameters. Such parameters may be saved until such time of transmission in memory 230, and more specifically in a NVM portion of memory 230. A cyclic redundancy code (CRC) calculation, forward error correction (FEC), and/or data redundancy may be further added to a packet for data validation at the receiver side. In one embodiment, when the voltage of the harvesting circuitry is determined to be decreasing at a high rate, i.e., the power line load was turned off, the device transmits a message containing the last counter value as no energy may be available until the load is switched on again.

When condition(s) to transmit is (are) met, the MCU can implement a carrier sense multiple access (CSMA) mechanism for the purpose of collision avoidance. The following steps are therefore taken. First, the receiver of the RF transceiver 240 is switched on. Second the receiver senses whether there are currently other transmissions. This is particularly important in the environment in which the SPPS operates, which is an environment rich with SPPSs, possibly a few hundreds of them. Third, upon determination that the air is free, the receiver is disabled and the transmitter of the RF transceiver 240 is enabled for transmission to send the information message; otherwise, the receiver us disabled and the circuit 200 is caused to sleep for a random time interval, after which the circuit 200 wakes-up and the sequence of steps is repeated until the desired transmission is completed. In one embodiment of the invention, after completion of transmission the transmitter is disabled and the receiver is enabled to receive an acknowledgement signal from the management unit. In another embodiment of the circuit 200 the information messages are short enough and the intervals between transmissions are long enough so that collisions are highly unlikely. In such an embodiment the transmission of the information message may take place without pre-sensing of the air, thereby conserving energy. In yet another embodiment of the invention, after transmission the receiver is activated to receive a clock synchronization signal. This allows synchronization between the clocks of MCU 220 and the management server 350 (see FIG. 3), and as further explained herein below.

In yet another embodiment of the invention sufficient amounts of energy are available in the circuit 200 for continuous or longer operation. This is possible in cases where the primary current is above a certain value. The MCU 220 can then remain on and perform signal processing on the non-rectified signal coming directly from the current transformer 212. The gathered information may be therefore transmitted more frequently. This is useful for example for measurements relating to peak values, average currents, phase calculation, frequency shift calculation, transient and irregular current over short period of time, and total harmonic distortion (THD). The reservoir voltage of energy harvester 216 is constantly measured by means of A/D converter 226 of MCU 220, in order to prevent overcharge. If necessary a discharge of the energy harvester 216 is performed through an I/O port. The voltage information further provides an indication of the available energy for keep-alive transmissions when no primary current exists. This may happen when the circuit breaker 120 tripped or was otherwise shutdown, or otherwise when no power is consumed by the electrical sub-network protected by the circuit breaker 120. In a further embodiment of the invention a 3-phase SPPS is implemented comprising three analog sections 210 each coupled to a single MCU 220, which is further coupled to the transceiver (240) and an antenna (250). The circuit is configured to handle three analog sections such that the single MCU 220 can handle the entire operation of a 3-phase SPPS. While a 3-phase SPPS is described it should be understood that a system comprising a plurality of analog sections may be implemented, for a single phase or multiple phase SPPS, thereby reducing the costs of such a multi-power-line-sensor SPPS.

Figure 3:
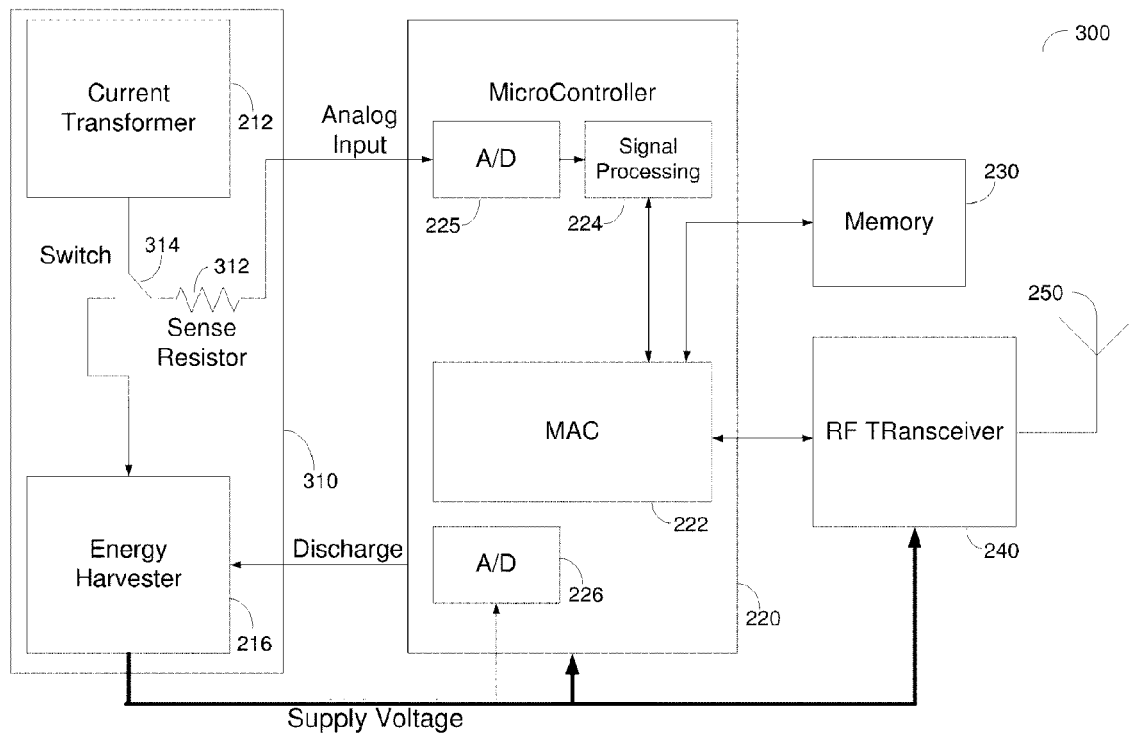
FIG. 3 is a block diagram of another exemplary SPPS.

Reference is now made to FIG. 3 where an exemplary and non-limiting second embodiment of a SPPS 300 is shown. A key difference may be observed in the microcontroller 220 that does not receive a pulse as an interrupt signal as was shown in the previously described embodiment of FIG. 2. Similar components to those of FIG. 2 are not further discussed herein, unless necessary for clarity. The notable change is in the analog section 310 that comprises a current transformer 212, an energy harvester 216, a switch 314 and a sense resistor 312. In normal operation the switch 314 is positioned to enable energy harvesting by the energy harvester 216. Periodically, for example under the control of the microcontroller 220, the switch 314 is activated to short the secondary winding of transformer 212 through the sense resistor 312, typically having a low resistance. The voltage on the sense resistor 312 is sampled by the ADC 225. In order for the SPPS 300 to identify a voltage peak the process is repeated several times in each cycle. The switch 314 is toggled between the two positions to enable energy harvesting most of the time in a first position, and measurement of the voltage periodically when in the second position. The sampling is averaged over a number of cycles and divided by the resistance value of the sense resistor 312 to provide the current value. The current value is then multiplied by a time interval to obtain the total charge value, for example, in Ampere Hours. A calibration factor can also be used with respect of SPPS 300.

Figure 4:
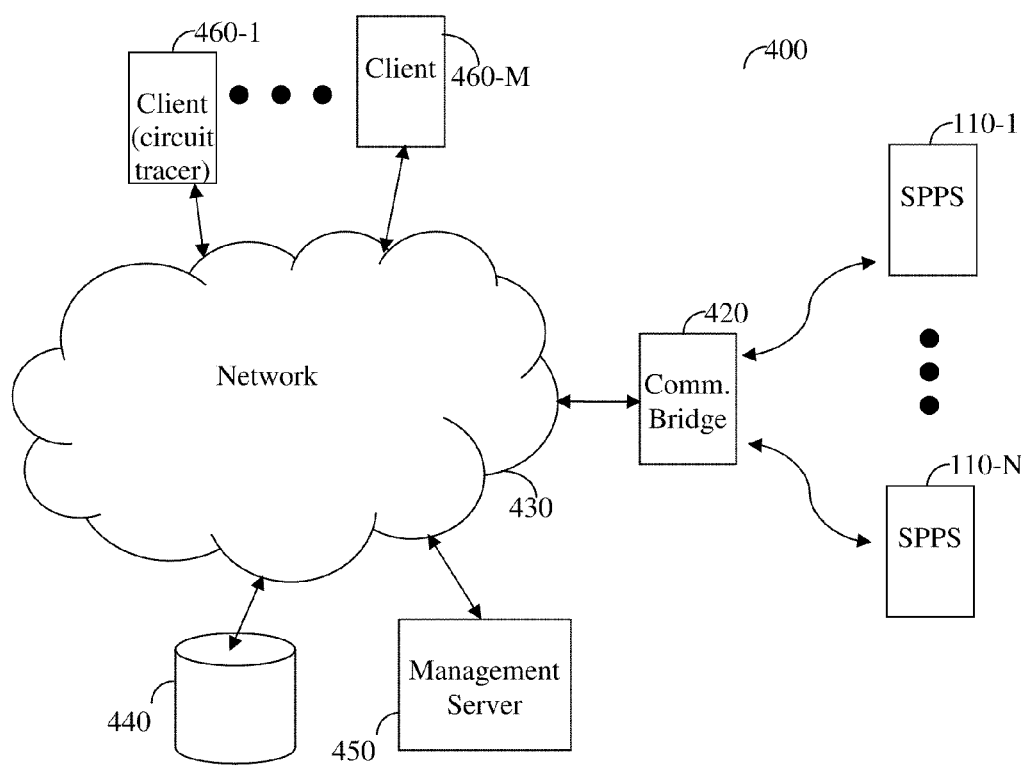
FIG. 4 is a schematic diagram of a system configured in accordance with the invention.

Reference is now made to FIG. 4 where an exemplary and non-limiting system 400, configured in accordance with the principles of the invention, is shown. The system comprises a plurality of SPPSs 110 communicatively coupled to a communication link/bridge 420. The SPPS 110 may be placed in an electrical panel board before or after respective circuit breakers 120 (FIG. 1), and/or at the inputs to specific power consuming devices. In the latter case it is not necessary for the SPPS 110 to be associated with a circuit breaker 120 but rather with a power consuming unit. The management server 450 is equipped with a transceiver enabling the communication with the plurality of SPPSs 110 using one or more of the communication schemes discussed herein above. The communication bridge 420 is configured to communicate with those SPPSs 110 it is configured to operate with, using for identification their respective unique IDs. The communication bridge 420 is coupled to a network 430 which may be, but is not limited to, a local area network (LAN), a wide area network (WAN), a metro area network (MAN), the Internet, the world wide web (WWW), the likes and combinations thereof, being wired or wireless. The communication link can be, but is not limited to, a WLAN (Wireless LAN), for example 802.11 also known as WiFi, a wireless sensor area network, for example 802.15.4 also known as Zigbee, power line communication (PLC), or a cellular to modem network such as GPRS or CDMA. In one embodiment of the invention the communication link aggregates the data from the plurality of SPPSs 110-1 to 110-N prior to sending it to the network. To the network there are coupled a database 440 to accumulate data collected by the communication bridge 420. A communication bridge 420 may be placed in each panel board and aggregate a plurality of SPPSs 110 communications. Therefore a plurality of bridges 420 may exist (but not shown for clarity) in the system 400. Further, coupled to the network is a management server 450 that, based on the data accumulated in database 440, may provide one or more clients 460 processed information respective of the collected data as well as to communicate with other application software, for example building management systems (BMSs).

According to the invention, one of the clients 460, for example client 460-1, is a circuit tracer. A circuit tracer 460 is typically a mobile device such as, but not limited to, a notebook computer, a personal digital assistant (PDAs), a smart phone, a tablet PC (such as 'iPad') which is coupled to the network 430, preferably wirelessly. It should be noted that while wireless communication with the network is preferred as it provides maximum mobility for the person tracing the association between a circuit breaker and an electricity outlet, wired communication is also possible. For example, the circuit tracer 460-1 may be equipped with an RJ-45 Ethernet communication link that can be connected to the network 430. A utility installed on the circuit tracer 460-1 provides a display of all the installed SPPSs 110 in the circuit breaker panel board. For avoidance of doubt, the utility does not have to be locally installed on the circuit tracer device, but can also operate as a local or remote web-service that uses a standard web browser while the circuit tracer is linked to the Internet or LAN. It should be noted that while it would be preferable to have an SPPS 110 installed for each circuit breaker, it is not a requirement of the invention herein. However, no association can be made for an electricity outlet for which its corresponding circuit breaker is not equipped with an SPPS 110. The user interface on the circuit tracer 460-1 preferably displays the physical location of the SPPS 110, such as the position of the circuit breaker panel board and the position of SPPS 110 inside of the circuit breaker panel board, where each SPPS 110 may have a unique sensor identification (ID). If known, a unique ID of the circuit breaker to which the sensor is attached and whose consumption it measures is also displayed. This field maybe left open and filled out by the person performing the tracing procedure. Following is a description of the operation of the system.

In an embodiment of the invention the circuit tracer 460 communicates directly with a communication bridge unit 420 rather than through the management server 450. This can be done by wired or wireless communication over the network 430. This embodiment may be used for circuit tracing of a single panel board locally and where there is no communication with the management server 450, or otherwise when the entire system 400 is not set up.

The user of circuit tracer 460-1 defines, using its user interface (UI), which of the circuit breaker panel boards is to take part in the circuit tracing process. This can include the entire grid, or one or more parts of it. Once defined, the user initiates the process by, for example, depressing a button of the UI, thereby directing the system to enter a tracing mode.

The tracing mode uses an embodiment of the SPPS 110 that enables reception of a signal, where among others, the receiver portion of the SPPS 110 to support features such as, and without limitation, sensing for a carrier signal, clock synchronization, acknowledgement, firmware download, and configuration download. The configuration of the SPPS 110 can now be turned to a continuous operation. It is sometimes necessary to enter such a tracing mode, as normally the SPPS 110 does not report instantly on current changes through the circuit breaker, but rather reports periodically on average current. In tracing mode, it is preferred to have the SPPSs 110 report current changes as soon as they occur. The circuit tracer 460-1 is configurable as to the period of time the system should be in this mode, for example, a one minute period, one hour, until instructed otherwise, indefinitely, and so on. Responsive thereto, a message is sent from the circuit tracer 460-1 to the management server 450 that forwards the message to the relevant bridge units, for example communication bridge 420, located in the electrical panel boards chosen by the user. In some cases, SPPSs 110 may be coupled to the network 330 directly and not through a communication bridge 420, and in such a case they receive the message directly from the management server 450. As noted above, in one embodiment the services of a management server 450 are not required and the entire communication is performed between the circuit tracer 460 and a communication bridge 420. The communication bridge 420 sends a message to the SPPS 110 within its respective range, and/or to those which it is responsible for the communication with. The message commands the SPPS 110 to enter into 'circuit tracing' mode for the defined period of time as discussed hereinabove. Depending on the specific embodiment of the invention, the communication bridge 420 may transmit the message to the SPPS 110 by either broadcasting to all sensors in the vicinity or directing the message to specific SPPSs 110 based on their respective IDs. In such a case the message from the management server 450 typically includes such specific information. It should be noted that in normal operation the SPPS 110 may not be in a receiving mode when a message is sent and therefore unable to receive the circuit tracing mode command. The SPPS 110 will open its receiver at its next schedule transmission period. The communication bridge 420 then detects such an occurrence and sends the command, thereby ensuring that the desired SPPS 110 enters the trace mode.

In accordance with one embodiment of the invention when a SPPS 110 is in 'trace mode' it ceases its regular scheduled and/or periodic transmissions. It also sends an acknowledgement message to the communication bridge 420 that it entered the 'tracing mode'. The communication bridge may forward such information to the management server 450 that in turn may forward this to the circuit tracer 460-1. As noted above, in one embodiment the services of a management server 450 are not required and the entire communication is performed between the circuit tracer 460 and a communication bridge 420. The UI of the circuit tracer 460-1 may now indicate that the specific SPPS 110 is ready for the tracing so that the user of the circuit tracer 460-1 can begin determining that all the SPPSs 110 that are to participate in the tracing process have entered the 'trace mode'. An SPPS 110 in the 'trace mode' waits for a circuit activation or deactivation event that can manifest as, but without limiting generality, a sudden increase or decrease in the consumed current or a sequence of current changes, for instance, a pre-defined series of on/off events. Upon determination of an occurrence of such an event the SPPS 110 transmits a message to the communication bridge 430 reporting of the occurrence of the event. When the predefined time expires, the SPPS 110 returns to normal mode.

In another preferred embodiment, the SPPS 110 is normally configured so that it sends instantly a special message to the network 430 whenever current consumption through the circuit breaker is turned on/off, increased/decreased by a predefined value, or follows a predefined sequence. This is provided in addition and/or instead of the SPPS's 110 normal periodic transmission. In that case, these special messages are used by the circuit tracer to identify load operation for the purpose of circuit tracing. In accordance with this embodiment, the process of configuring the SPPS 110 to circuit tracing mode through the bridge 420 is not required. In this embodiment, it may still be required to configure the management server 450, communication bridge 420 and/or circuit tracer 460-1 into tracing mode for a predefined time as previously described herein above. This allows filtering out regular messages that are not relevant to the circuit tracing process. In this embodiment, when the circuit tracer user defines which panels are to participate in the circuit tracing process, this can also be used to filter out circuit tracing messages that occur in panel boards that are not of interest to the user.

Once the system is ready the user of the circuit tracer 460-1 is advised, for example by displaying a message on the UI of the circuit tracer 460-1, to begin the loading process for the purpose of circuit tracing. If the load under investigation is an outlet, the user plugs in a loading device (not shown) into the outlet and turns it on. The load is designed to draw current from the outlet in accordance with a profile consistent with the expectation of the respective SPPS 110. That is, the loading device should have a pre-defined load, or a pre-defined activation/deactivation sequence to be identified by the system. If the load under investigation is a fixed load, for example, a light source or heating/ventilation/air-conditioning (HVAC) system, a single turn on will do, but a pre-defined on/off sequence by the user is also possible, for example a sequence of 3 on/off sequences within a predefined period of time. Using a sequence of on/off is advantageous because, unlike with other prior art solutions, the entire grid is kept operative throughout the tracing procedure and hence changes in current consumption are to be expected. Upon identification of a load event the respective SPPS 110 transmits an appropriate message to the communication bridge 420 that in turn transfers such information to the management server 450. In one embodiment of the invention, identification of a predefined activation sequence is performed by the management server 450 or by the bridge 420. This requires the respective SPPS 110 to transmit a message at each change of current consumption, preferably though when an abrupt change is detected.

Upon compilation of the information received by the management server 450, the management server sends the circuit tracer 460-1 a message that includes the ID of the SPPS 110 that was activated. In an embodiment where the circuit tracer 460-1 is directly connected to the communication bridge 420, the SPPS 110 message is sent directly to the circuit tracer 460-1 through the communication bridge 420, and the information compilation is done on the circuit tracer 460-1. In one embodiment of the invention a visual indication appears on the user's UI. For example and without limitation, the relevant SPPS 110 image is highlighted, changes color, or a popup message with the sensor ID appears. The user is now prompted to enter the association information to the system using the UI of the circuit tracer 460-1. This may include manual entering of the information respective of the electricity outlet or with information already available on or through the circuit tracer 360-1, which enables the display of the location of the electricity outlet or the power load on the UI. After the preset time for circuit tracing expires, all sensors continue to transmit normally. Alternatively, if the mode was set for an indefinite time, the user may release the system from 'trace mode' by sending a release command using the UI. A message is sent to the management server 450, the communication bridges 420 and SPPSs 110 with a message to resume normal transmission mode. Once the process is complete, a reliable and repeatable association of SPPS 110 and electricity outlets exists.

The principles of the invention, wherever applicable, are implemented as hardware, firmware, software or any combination thereof. Moreover, the software is preferably implemented as an application program tangibly embodied on a program storage unit or computer readable medium. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such computer or processor is explicitly shown. In addition, various other peripheral units may be connected to the computer platform such as an additional data storage unit and a printing unit. The circuits described hereinabove may be implemented in a variety of manufacturing technologies well known in the industry including but not limited to integrated circuits (ICs) and discrete components that are mounted using surface mount technologies (SMT), and other technologies. The scope of the invention should not be viewed as limited by the exemplary types of packaging and physical implementation of the SPPSs 110 or the communication bridge 420, nor with respect of the circuits 200 and 300.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. A circuit tracer system for associating each of a plurality of power consuming devices with a respective one of a plurality of circuit breakers comprising:
a plurality of self-powered power sensors (SPPSs), each SPPS being wrapped around a wire providing current solely to a circuit breaker or to a wire providing current solely to a power consuming device of the plurality of power consuming devices without being electrically connected to the respective wire and using a current flowing through the respective wire for current measurement as well as an independent source of power for the SPPS, each SPPS having a unique identification (UID), each SPPS comprising:

a current transformer having the wire as a primary winding of the current transformer and a secondary winding to harvest energy and sense current from the primary winding;
a sense resistor;
an energy harvester, the energy harvester connected to the secondary winding to supply power to the SPPS responsive of harvesting energy from the secondary winding; a switching circuitry connected to a first terminal of the secondary winding, the switching circuitry either connecting the energy harvester to the first terminal of the secondary winding for harvesting of energy or connecting the sense resistor to the first terminal of the secondary winding for current sensing;
a radio frequency wireless transceiver powered by the energy harvester; and,
a microcontroller connected to the sense resistor, the energy harvester, the switching circuitry and the radio frequency transceiver, the microcontroller configured when the SPPSs are in a trace mode to: a) determine sufficiency of energy in the energy harvester; b) measure current flowing in the current wire upon determination of at least a first level of energy in the energy harvester; c) transmit data collected respective of at least the current flowing in the current wire and the UID of the SPPS using the radio frequency wireless transceiver upon determination of at least a second level of energy in the energy harvester; and, d) control the switching circuitry respective of determination of sufficiency of energy in the energy harvester;
the circuit tracer system further having;
a communication bridge for at least receiving signals respective of the measured current from each of the plurality of SPPSs that are wirelessly transmitted by each SPPS over a first network;
a second network communicatively connected to the communication bridge; and,
a server communicatively coupled to the second network, the server comprising:
a processor for processing a circuit tracer utility stored in a memory;
a user interface displayed on a display communicatively coupled to the server configured to: receive current measurements from a first SPPS of the plurality of SPPSs, the first SPPS associated with a circuit breaker; receive current measurements from a second SPPS of the plurality of SPPSs, the second SPPS associated with a power consuming device; and, make an association between the first SPPS and the second SPPS upon determination that a change in current measured by the first SPPS and a change in current measured by the second SPPS occurred concurrently.

2. The circuit tracer system of claim 1, wherein the power consuming device is one of: a device connected to an outlet, a device connected through a switch, a device wired directly to the board, a light source, HVAC, pump, or electrical machinery.

3. The circuit tracer system of claim 1, wherein the user interface is installed on one of a personal computer (PC), notebook computer, personal digital assistant (PDA), smart phone, or tablet PC.

4. The circuit tracer system of claim 1, wherein a message is sent over the network to cause the SPPS to enter into the trace mode.

5. The circuit tracer system of claim 1, wherein each SPPS of the plurality of SPPSs can be configured to enter into the trace mode for a predefined period of time in which each SPPS of the plurality of SPPSs transmits a message to the communication bridge upon determination of one of: an increase in current, a decrease of current, or a predefined series of on/off events.

6. The circuit tracer system of claim 1, wherein the user interface provides an option to a user to cause an SPPS put into the trace mode for an indefinite period of time to exit the trace mode.

7. The circuit tracer system of claim 1, wherein a message is sent by at least one SPPS that is configured to send tracing messages by the server.

8. The circuit tracer system of claim 1, wherein the second network is at least one of: local area network (LAN), wide area network (WAN), metro area network (MAN), the internet, the worldwide web (WWW), a wireless network, or any combination thereof.

9. A method for associating a power consuming device with a circuit breaker in a circuit containing a plurality of power consuming devices and a plurality of circuit breakers, each of the plurality of power consuming devices and each of the plurality of circuit breakers being uniquely associated with a self-powered power sensor (SPPS), each SPPS being wrapped around a wire providing current solely to a circuit breaker or to a wire providing current solely to a power consuming device of the plurality of power consuming devices without being electrically connected to the respective wire and using a current flowing through the respective wire for current measurement as well as an independent source of power for the SPPS, each SPPS having a unique identification (UID), wherein each SPPS comprises: a current transformer having the wire as a primary winding of the current transformer and a secondary winding to harvest energy and sense current from the primary winding; a sense resistor connected to the secondary winding; an energy harvester, for connecting to the secondary winding to supply power to the SPPS responsive of harvesting energy from the secondary winding; a switching circuitry connected to a first terminal of the secondary winding, the switching circuitry connecting the energy harvester to the first terminal of the secondary winding, or connecting the sense resistor to the first terminal of the secondary winding in a sensing mode of operation; a radio frequency wireless transceiver powered by the energy harvester; and, a microcontroller connected to the sense resistor, the energy harvester, the switching circuitry and the radio frequency transceiver, the microcontroller configured to: a) determine sufficiency of energy in the energy harvester; b) current flowing in the current wire upon determination of at least a first level of energy in the energy harvester; c) transmit data collected respective of at least the current flowing in the current wire using the radio frequency wireless transceiver upon determination of at least a second level of energy in the energy harvester; and, d) control the switching circuitry respective of determination of sufficiency of energy in the energy harvester; the method comprising:
displaying each circuit breaker on a display using a user interface;
sending a message to the plurality of SPPSs to enter a trace mode;
displaying on the display that the circuit is in the trace mode;
receiving from a first SPPS of the plurality of SPPSs, the first SPPS associated with a power consuming device, a message containing current measurements and the UID of the first SPPS;

receiving from a second SPPS of the plurality of SPPSs, the second SPPS associated with a circuit breaker, information respective of current measurements and the UID of the second SPPS;

determining whether when a change in current measured by the first SPPS there was a corresponding change in current measured by the second SPPS; and associating the power consuming device associated with the first SPPS with the circuit breaker associated with the second SPPS respective of the determination.

10. The method of claim 9, wherein the user interface is configured to be operative on one of a personal computer (PC), notebook computer, tablet PC, personal digital assistant (PDA), or smart phone.

11. The method of claim 9, wherein the trace mode is of a duration limited to a predefined period of time in which each SPPS of the plurality of SPPSs transmits a message to the communication bridge upon determination of one of: an increase in current, a decrease of current, or a predefined series of on/off events.

12. The method of claim 9, wherein when the trace mode is entered for an indefinite period of time, the method further comprises:

sending a message to the at least a SPPS to exit the trace mode.

13. The method of claim 9, wherein the power consuming device is one of: a device connected through an outlet, a device connected through a switch, a device connected directly to the electrical board, a light source, HVAC, pump, or electrical machinery.

* * * * *